United States Patent
Mitsuhashi et al.

(10) Patent No.: US 6,919,148 B2
(45) Date of Patent: Jul. 19, 2005

(54) MEMBER FOR A MASK FILM, PROCESS FOR PRODUCING A MASK FILM USING THE MEMBER AND PROCESS FOR PRODUCING A PRINTING PLATE OF A PHOTOSENSITIVE RESIN USING THE MASK

(75) Inventors: Masafumi Mitsuhashi, Atsugi (JP); Tomishi Shibano, Higashimatsuyama (JP)

(73) Assignee: Lintec Corporation, Tokyo (JP)

( * ) Notice: Subject to any disclaimer, the term of this patent is extended or adjusted under 35 U.S.C. 154(b) by 162 days.

(21) Appl. No.: 10/348,560

(22) Filed: Jan. 21, 2003

(65) Prior Publication Data

US 2003/0143471 A1 Jul. 31, 2003

(30) Foreign Application Priority Data

Jan. 28, 2002 (JP) ........................................ 2002-018674

(51) Int. Cl.⁷ .............................. G03F 9/00; G03F 7/00; G03C 1/76
(52) U.S. Cl. .......................... 430/5; 430/300; 430/271.1
(58) Field of Search ................................. 430/306, 308, 430/5, 320, 321, 270.1, 271.1, 300

(56) References Cited

U.S. PATENT DOCUMENTS

2002/0045131 A1 * 4/2002 Nagase et al. .............. 430/292

FOREIGN PATENT DOCUMENTS

| JP | 05-24172 | 2/1993 |
| JP | 10-67088 | 3/1998 |

OTHER PUBLICATIONS

U.S. Appl. No. 11/048,484, filed Feb. 1, 2005.

* cited by examiner

Primary Examiner—Mark F. Huff
Assistant Examiner—Saleha Mohamedulla
(74) Attorney, Agent, or Firm—Frishauf, Holtz, Goodman & Chick, P.C.

(57) ABSTRACT

A member for a mask film comprising a substrate film transmitting ultraviolet light and a resin layer not transmitting ultraviolet light which is disposed on one face of the substrate film, allows elimination of color by irradiation with a laser beam, has a transmittance of ultraviolet light of 0.1% or smaller and has a thickness of 0.1 to 30 $\mu$m; a process for producing a mask film using the member; and a process for producing a printing plate of a photosensitive resin using the mask film. The mask is advantageously used for preparing a printing plate such as a photosensitive printing plate. The member for a mask provides the mask film by etching with a laser beam.

20 Claims, No Drawings

MEMBER FOR A MASK FILM, PROCESS FOR PRODUCING A MASK FILM USING THE MEMBER AND PROCESS FOR PRODUCING A PRINTING PLATE OF A PHOTOSENSITIVE RESIN USING THE MASK

BACKGROUND OF THE INVENTION

1. Field of the Invention

The present invention relates to a member for a mask film, a process for producing a mask film using the member and a process for producing a printing plate of a photosensitive resin using the mask film. More particularly, the present invention relates to a member for a mask film which is advantageously used for producing a mask film used for preparing a printing plate of a photosensitive resin such as a flexographic printing plate, does not require treatments with chemicals, provides excellent resolution by etching with a laser beam and can be used for preparing a printing plate having a great size; a process for producing a mask film using the member; and a process for producing a printing plate of a photosensitive resin using the mask film.

2. Description of Related Art

Printing plates such as flexographic printing plates which are formed by irradiating a photosensitive resin layer of a printing plate material having the photosensitive resin layer with light through a mask film used as a negative film having a desired pattern, followed by removing portions of the photosensitive resin layer not exposed to the light by washing, has heretofore been known.

The mask film used for preparing the printing plate of a photosensitive resin is produced, in general, in accordance with a photographic process using silver salts or various printing processes such as a process using a laser printer. However, these processes cannot be used for preparing a mask having a great size. For example, when a mask having a great size such as the size of a news paper is required, two or more mask films are used and combined together in a manner such that an image is formed without disturbance. Moreover, the photographic process has a drawback in that procedures are complicated since the operations must be conducted in a dark room specific for the photographic process and treatments with a plurality of chemicals are required although the photographic process provides excellent resolution. On the other hand, in the case of the printing process, the operation is simple since a pattern can be formed directly by a printer using digital data. However, the process provided by ZANTE Company (a United States company) using a laser printer has drawbacks in that a treatment with a chemical is necessary to improve the property of a mask film not transmitting light and the resolution is not sufficient.

As the technology using a laser beam in the field of preparing printing plates, for example, a resin printing plate having depressed portions for printing which are formed by irradiating with a laser beam desired portions of a resin layer in a printing plate having the resin layer on the surface so that the desired portions of the resin layer is sublimed or decomposed (Japanese Patent Application Laid-Open No. Heisei 5(1993)-24172) and a printing plate which is formed, using a resin printing plate material having a resin layer sensitive to ionizing radiation and a layer not transmitting ionizing radiation disposed on a substrate, by removing portions of the layer not transmitting ionizing radiation corresponding to a printing image with a laser beam, followed by irradiating the portions of the resin layer sensitive to ionizing radiation corresponding to the portions removed above with ionizing radiation and by subjecting the portions of the resin layer sensitive to ionizing radiation irradiated above to a development treatment (Japanese Patent Application Laid-Open No. Heisei 10(1999)-67088), have been disclosed.

However, in the above technology, a printing plate is prepared by directly irradiating a resin printing plate with a laser beam without using a mask film and the technology is not related to the production of a mask film.

SUMMARY OF THE INVENTION

The present invention has an object of providing a member for a mask film which is advantageously used for producing a mask film used for preparing a printing plate of a photosensitive resin such as a flexographic printing plate, does not require treatments with chemicals, provides excellent resolution by etching with a laser beam and can be used for preparing a printing plate having a great size; a process for producing a mask film using the member; and a process for producing a printing plate of a photosensitive resin using the mask film.

As the result of extensive studies by the present inventors to achieved the above object, it was found that the object could be achieved by a member having a substrate film transmitting ultraviolet light and a resin layer not transmitting ultraviolet light which has a specific thickness and specific properties and disposed on one face of the substrate. The present invention has been completed based on the knowledge.

The present invention provides:

(1) A member for a mask film comprising a substrate film transmitting ultraviolet light and a resin layer not transmitting ultraviolet light which is disposed on one face of the substrate film, allows elimination of color by irradiation with a laser beam, has a transmittance of ultraviolet light of 0.1% or smaller and has a thickness of 0.1 to 30 µm;

(2) A member described in (1), wherein the resin layer not transmitting ultraviolet light comprises a blackish pigment;

(3) A member described in any one of (1) and (2), wherein the resin layer not transmitting ultraviolet light comprises at least one of vinyl chloride-vinyl acetate copolymers and polyurethane-based resins;

(4) A member described in any one of (1) to (3), wherein a surface of the resin layer not transmitting ultraviolet light has a pencil hardness of H or greater;

(5) A process for producing a mask film which comprises etching a resin layer not transmitting ultraviolet light in a member for a mask film described in any one of (1) to (4) by irradiation with a laser beam and a desired pattern is formed;

(6) A process for producing a printing plate of a photosensitive resin which comprises using a mask film obtained in accordance with a process described in (5); and (7) A process described in (6), wherein the printing plate of a photosensitive resin is a flexographic printing plate.

DESCRIPTION OF THE PREFERRED EMBODIMENTS

The member for a mask film of the present invention is a member for a mask film which comprises a substrate film transmitting ultraviolet light and a resin layer not transmitting ultraviolet light disposed on one face of the substrate and is used for preparing a printing plate by etching desired portions of the resin layer by irradiation with a laser beam.

The substrate film used for the member for a mask film is not particularly limited as long as the substrate film has the property of transmitting ultraviolet light. A film having a transmittance of active light for curing a printing plate of a photosensitive resin of 20% or greater at the characteristic wavelength of the light source (for example, a 360 nm UV lamp) and exhibiting excellent heat resistance, dimensional stability under heating and mechanical properties is preferable. Examples of the substrate film include films of polyester-based resins such as polyethylene terephthalate and polyethylene naphthalate, polyamide-based resins, polyimide-based resins, polyamide imide-based resins, polyether ether ketone-based resins, polyether sulfone-based resins, polyether imide-based resins, polysulfone-based resins, polyphenylene sulfide-based resins, polyester imide-based resins and mixture of these resins. The thickness of the substrate film is selected, in general, in the range of 25 to 250 $\mu$m and preferably in the range of 80 to 200 $\mu$m.

In the present invention, the face of the substrate film on which the resin layer not transmitting ultraviolet light is to be disposed may be subjected to the mat treatment, where desired. By the mat treatment of the substrate film, adhesion with an uncured printing plate material of a photosensitive resin can be improved. An improvement in the accuracy of printing can be expected and removal of the substrate film from the printing plate material of a photosensitive resin after the curing can be facilitated. Thus, workability is improved. Examples of the mat treatment include the chemical mat treatment and the sand mat treatment. The roughness obtained by the mat treatment is about 0.05 to 2.0 $\mu$m as Ra.

In the member for a mask film of the present invention, the average thickness of the resin layer not transmitting ultraviolet light which is disposed on one face of the above substrate film is selected in the range of 0.1 to 30 $\mu$m. When the thickness is smaller than 0.1 $\mu$m, it is difficult that the desired property of suppressing transmission of light is obtained. When the thickness exceeds 30 $\mu$m, the accuracy of parting lines in printing decreases. Moreover, there is the possibility that it takes a longer time for etching with the laser beam and the mask film is deformed due to the heat generated by the laser beam. It is preferable that the average thickness is in the range of 0.5 to 20 $\mu$m and more preferably in the range of 0.8 to 10 $\mu$m.

The resin layer not transmitting ultraviolet light is selected in a manner such that the member for a mask film of the present invention has a transmittance of ultraviolet light of 0.1% or smaller. When the transmittance exceeds 0.1%, there is the possibility that the accuracy is insufficient in the formation of a pattern corresponding to the pattern on the mask film by irradiating the photosensitive resin layer with the active light via the mask film obtained by using the member for a mask film, followed by developing the irradiated photosensitive layer.

The resin layer not transmitting ultraviolet light may comprise a blackish pigment so that the resin layer does not transmit ultraviolet light. Examples of the blackish pigment include carbon black, black chromium oxide, titanium black, black iron oxide, black organic pigments such as aniline black and mixed organic pigments obtained by mixing at least two organic pigments selected from red, blue, green, violet, yellow, cyan and magenta so as to exhibit an artificial black color. The blackish pigments may be used singly or in combination of two or more. Among the above blackish pigments, carbon black is preferable since the degree of blackness is great, uniform mixing in the resin layer can be achieved due to the small particle diameter and no residual colored substances remain due to complete decomposition into carbon dioxide gas. The types of carbon black include channel black, furnace black, acetylene black and thermal black in accordance with the process of production. Any of these types of carbon black can be used. The average diameter of carbon black is, in general, in the range of about 10 to 30 nm.

The content of the blackish pigment in the resin layer is suitably selected in accordance with the type of the blackish pigment. When carbon black is used as the blackish pigment, the content is, in general, in the range of about 20 to 60% by weight.

The resin used for the resin layer not transmitting ultraviolet light is not particularly limited as long as dispersion of the blackish pigment is excellent so that the resin layer suppresses transmission of ultraviolet light sufficiently even when the thickness of the layer formed with the resin is small and the surface of the resin layer does not have tackiness. Various resins can be used for the resin layer not transmitting ultraviolet light. Examples of the resin include vinyl chloride-vinyl acetate copolymers, ethylene-acrylate-based copolymers, styrene-based copolymers, polyolefin-based copolymers, acrylic resins, vinyl acetate-based copolymers, polyurethane-based resins, vinyl chloride-based resins and vinylidene chloride-based resins. The resins may be used singly or in combination of two or more. Among the above resins, vinyl chloride-vinyl acetate copolymers, polyurethane-based resins and mixed resins of vinyl chloride-vinyl acetate copolymers and polyurethane-based resins are preferable.

When the resin layer having the above composition is irradiated with a laser beam of a great output power, the blackish pigment absorbs the energy of the laser beam having a selected wavelength and the irradiated portion is locally heated. The blackish pigment and the resin in the heated portion of the resin layer are decomposed or sublimed by the heat and the blackish pigment disappears. Thus, the color of the portion of the resin layer is eliminated and the resin layer transmits ultraviolet light. It is preferable that the portion of the member for a mask film where the color has been eliminated by irradiation with the laser beam has a transmittance of ultraviolet light of 20% or greater similarly to that of the substrate film transmitting ultraviolet light.

In the present invention, the above resin layer can be formed by preparing a coating fluid comprising a suitable solvent, the above blackish pigments and the above resin, followed by applying the prepared coating fluid to one face of the substrate film in accordance with a conventional coating process such as the bar coating process, the knife coating process, the roll coating process, the blade coating process, the die coating process and the gravure coating process and by treating the formed coating layer by drying under heating and curing.

It is preferable that the surface of the resin layer obtained as described above has a pencil hardness of H or greater. When the surface has a pencil hardness smaller than H, the resin layer in the mask film obtained by using the member for a mask film of the present invention tends to have damages and there is the possibility that the accuracy of printing decreases. In the present invention, a clear coating layer comprising an acrylic resin may be formed on the above resin layer to protect the resin layer, where desired.

The mask film in the present invention can be prepared in accordance with the process which comprises etching the resin layer not transmitting ultraviolet light in the member for a mask film obtained as described above by irradiation with a laser beam and forming a desired pattern.

As the laser oscillator used in the above process, for example, an infrared laser such as a carbon dioxide gas laser (the wavelength of oscillation: 1,060 nm), a neodymium YAG laser (the wavelength of oscillation: 1,060 nm) and a neodymium glass laser (the wavelength of oscillation: 1,060 nm) can be used. Among the above laser oscillators, neodymium YAG laser is preferable. The laser oscillator may be any of the continuous oscillation type or the pulse oscillation type. The output power can be suitably selected in accordance with the thickness of the resin layer not transmitting ultraviolet light and the type of the resin. When the oscillator of the continuos oscillation type is used, in general, the output power is in the range of about 0.5 to 10 kW.

It is preferable that an apparatus allowing irradiation of any desired portions by the digital control is used as the laser oscillator. When such an apparatus is used, the pattern of printing is memorized by a computer as digital data and the mask film can be prepared by the control by a computer.

The application of the mask film prepared in accordance with the present invention is not particularly limited. The mask film can be used for various applications in which a film of the transmission type having a desired pattern is used as the mask. For example, the mask film is advantageously used as the mask for preparation of a printing plate of a photosensitive resin. Examples of the printing plate of a photosensitive resin to which the present invention is applied include the flexographic printing plate, the letter press printing plate, the offset printing plate, the gravure printing plate and the screen printing plate. Among these applications, it is preferable that the present invention is applied to the negative film used in the preparation of the flexographic printing plate.

A solder resist is used in the production of a printed circuit board to form a coating film on the entire surface of an electrically conductive material of a circuit except the portion used for soldering. When electronic members are soldered to the printed circuit board, the solder resist plays the role of a protective film for preventing attachment of solder to portions other than the portions necessary for the soldering and preventing corrosion of the electrically conductive material of a circuit with oxygen and moisture by direct exposure to the air.

As the solder resist, in general, a solder resist comprising a photosensitive resin which is developed with a dilute alkali is used. The solder resist is used as follows: a substrate of a printed circuit is coated with the solder resist; the surface of the formed coating layer is dried in a temporary drying step until tackiness is not exhibited; and the solder resist thus formed is exposed to light via a mask film, subjected to the development treatment with a dilute alkaline solution and cured by heating.

The mask film obtained in the present invention can be used also as the mask film of a solder resist.

The printing plate of a photosensitive resin in the present invention can be prepared by using the mask film described above. Examples of the printing plate of a photosensitive resin include various printing plates described above. Among these printing plates, the flexographic printing plate is preferable.

For preparing the flexographic printing plate, for example, a printing plate material which is made of an uncured photosensitive resin soluble in a developing solution (a washing solution) and has a sheet form is used. The portion of the photosensitive resin irradiated with an active light such as ultraviolet light becomes insoluble in the developing solution due to curing by a reaction such as crosslinking and polymerization. The printing plate material occasionally has a structure having a plurality of layers comprising a substrate layer of a rubbery elastomer such as polyisoprene and NBR.

In general, the flexographic printing plate can be prepared in accordance with the following process.

The back face of the flexographic printing plate material is subjected to the preliminary exposure to ultraviolet light. The mask film obtained in accordance with the present invention which has a desired pattern is used as the negative film and tightly attached to the back face of the printing plate material in a manner such that the resin layer not transmitting ultraviolet light of the mask film is attached to the printing plate material. The flexographic printing plate material is subjected to the major exposure to ultraviolet light via the attached mask film. Then, the mask film is removed and the remaining printing plate material is treated by development (washing) to remove the resin in the unexposed portions, followed by drying. The resultant printing plate material is further subjected to the post-exposure to ultraviolet light and the desired flexographic printing plate can be obtained. For each exposure to ultraviolet light, in general, ultraviolet light in the wavelength range of 300 to 400 nm is used.

The flexographic printing plate prepared as described above has, in general, a Shore A hardness of about 40 to 50.

To summarize the advantages obtained by the present invention, the member for a mask film is advantageously used for producing a mask film used for preparing a printing plate of a photosensitive resin such as a flexographic printing plate, does not require treatments with chemicals, provides excellent resolution by etching with a laser beam and can be used for preparing a printing plate having a great size.

Using the member for a mask film, a mask film and a printing plate of a photosensitive resin having a desired pattern can be provided.

EXAMPLES

The present invention will be described more specifically with reference to examples in the following. However, the present invention is not limited to the examples.

Example 1

One face of a polyethylene terephthalate (PET) film having a thickness of 188 $\mu$m was subjected to the mat treatment by sand blasting (the roughness of the mat: 0.39 $\mu$m as Ra). The treated face was coated with a resin fluid containing carbon black [manufactured by DAINICHI-SEIKA COLOR & CHEMICALS MFG. Co., Ltd.; the trade name: "MU1720 BLACK"; the resin component: a vinyl chloride-vinyl acetate copolymer; the average diameter of carbon black: 14 nm; the content of non-volatile components: 29% by weight; the ratio by weight of the resin component/carbon black: 2/1] in an amount such that the average thickness was 2 $\mu$m after being dried. The formed coating layer was dried to form a resin layer not transmitting ultraviolet light and a member for a mask film was prepared. The properties of the member are shown in Table 1.

Example 2

One face of a PET film having a thickness of 188 $\mu$m was subjected to the mat treatment by sand blasting. The treated face was coated with a resin fluid containing carbon black [manufactured by DAINICHI-SEIKA COLOR & CHEMICALS MFG. Co., Ltd.; the trade name: "SEIKA SEVEN ALT8794 BLACK"; the resin component: a polyurethane; the content of non-volatile components: 30.5% by weight; the ratio by weight of the resin component/carbon black: 1/1] in an amount such that the average thickness was 1 μm after being dried. The formed coating layer was dried to form a resin layer not transmitting ultraviolet light and a member for a mask film was prepared. The properties of the member are shown in Table 1.

Example 3

One face of a PET film having a thickness of 188 μm was subjected to the mat treatment by sand blasting. The treated face was coated with a mixed fluid prepared from 100 parts by weight of a resin fluid containing carbon black ["MU1720 BLACK" described above], 10 parts by weight of a polyurethane resin fluid [manufactured by DAINICHI-SEIKA COLOR & CHEMICALS MFG. Co., Ltd.; the trade name: "LEATHEROID LU-2830HV"; the content of non-volatile components: 30% by weight] and 0.2 parts by weight of a polyisocyanate-based crosslinking agent [manufactured by DAINICHI-SEIKA COLOR & CHEMICALS MFG. Co., Ltd.; the trade name: "RESAMINE NE-C"; the content of non-volatile components: 75% by weight] in an amount such that the average thickness was 2 μm after being dried. The formed coating layer was dried to form a resin layer not transmitting ultraviolet light and a member for a mask film was prepared. The properties of the member are shown in Table 1.

Comparative Example 1

One face of a PET film having a thickness of 188 μm was subjected to the mat treatment by sand blasting. The treated face was coated with a resin fluid containing a dye [manufactured by TOYO INK SEIZO Co., Ltd.; the trade name: "AIZEN SPILON BLACK FS-LIQUID"; the content of non-volatile components: 30% by weight] in an amount such that the average thickness was 4 μm after being dried. The formed coating layer was dried to form a resin layer not transmitting ultraviolet light and a member for a mask film was prepared. The properties of the member are shown in Table 1.

TABLE 1

|  | Example | | | Comparative Example | |
|---|---|---|---|---|---|
|  | 1 | 2 | 3 | 1 | |
| Type of resin | vinyl chloride-vinyl acetate copolymer | poly-urethane | vinyl chloride-vinyl acetate copolymer + poly-urethane | — | PET alone (188 μm thick, mat treated) |
| Average thickness of resin layer (μm) | 2 | 1 | 2 | 4 | — |
| Transmittance (%) ultraviolet light (360 nm) | 0.01> | 0.01> | 0.01> | 0.15 | 62.6 |
| laser beam (1,060 nm) | 0.57 | 0.01> | 1.1 | 83.0 | 81.3 |
| Transmittance of ultraviolet light (360 nm) after etching | 56.7 | 52.0 | 55.4 | 49.2 | — |
| Pencil hardness | 3H | H | H | HB | — |

Notes
(1) Transmittance: Using a spectrophotometer for ultraviolet and visible light, the transmittance at a wavelength of 360 nm or 1,060 nm was measured.
(2) Pencil hardness: The pencil hardness was measured in accordance with the method of Japanese Industrial Standard K 5400.

The PET film having a thickness of 188 mm which had been subjected to the mat treatment had a transmittance of light having a wavelength of 360 nm of 62.6% and a transmittance of light having a wavelength of 1,060 nm of 81.3%.

Example 4

Preparation of a mask film using the member for a mask film obtained in Example 1, preparation of a flexographic printing plate using the prepared mask film and the printing test of the prepared flexographic printing plate were conducted in accordance with the following procedures.

(1) Preparation of a Mask Film

Patterns of solids, characters of various sizes (the font: Helvetica), lines and nets were created as negative or positive patterns and used for the test of accuracy of printing. The patterns were digitally processed and taken into an apparatus for irradiation with a laser beam (a neodymium YAG laser oscillator emitting a laser beam having a wavelength of 1,060 nm; the output power: 25 kW).

The resin layer not transmitting ultraviolet light of the member for a mask film prepared in Example 1 was irradiated continuously with the laser beam from the apparatus for irradiation with a laser beam and the etching was conducted tracing the patterns. Thus, a mask film was prepared.

(2) Preparation of a Flexographic Printing Plate

Using a machine for preparing a flexographic printing plate [manufactured by TAKANO KIKAI SEISAKUSHO Co., Ltd.; the trade name: "DX-A3"], the following successive steps for preparation of a flexographic printing plate were conducted continuously and a flexographic printing plate was prepared.

The back face of a flexographic printing plate material of a photosensitive resin [manufactured by Du Pont Company; the trade name: "SIREL AQS"; the thickness: 1.7 mm] was irradiated with ultraviolet light having a wavelength of 360 nm for 55 seconds for the preliminary exposure to ultraviolet light. Then, the mask film obtained above in (1) was tightly attached to the back face of the flexographic printing plate material treated above in a manner such that the resin layer not transmitting ultraviolet light of the mask film is attached to the printing plate material and the major exposure to ultraviolet light was conducted via the mask film for 14 minutes.

The mask film was removed from the printing plate material by peeling and the printing plate material was washed with water containing 3% by weight of a surfactant at 55° C. for 11 minutes and 30 seconds to remove portions of the printing plate material not exposed to ultraviolet light. The printing plate material was then dried at 70° C. for 20 minutes and irradiated with ultraviolet light for 35 minutes for the post-exposure to ultraviolet light. Thus, a flexographic printing plate for the printing test having a desired pattern was obtained.

(3) Printing Test

Using the flexographic printing plate obtained above in (2), the printing test was conducted in accordance with the following condition and the properties were evaluated. The results of the evaluation are shown in Table 2.

Flexographic printing machine: manufactured by LINTEC Corporation; the trade name: "MA2200"

Printed article: coated paper [manufactured by OJI SEISHI Co., Ltd.; the trade name: "OK TOP COAT 127.9 g/m2"]

Ink: manufactured by T & K TOKA Co., Ltd.; the trade name: "UV FLEXO INDIGO"

Printing speed: 50 m/min (4) Accuracy of Printing

The accuracy of printing of the test pattern by the printing plate was evaluated by visual observation in accordance with the following criteria:

Character excellent: Patterns of the 2 pt size or smaller were clearly printed.

good: Patterns of the 3 pt size were clear and patterns of the 2 pt size were not clear.

poor: Patterns of the 3 pt size were not clear.

Line excellent: Patterns of the 0.1 pt size were clearly printed.

good: Patterns of the 0.2 pt size were clear and patterns of the 0.1 pt size were not clear.

poor: Patterns of the 0.2 pt size were not clear.

Net excellent: The shape and the size of the net points were reproduced evenly.

good: The shape and the size of the net points were reproduced slightly unevenly.

poor: The shape and the size of the net points were reproduced unevenly.

Solid excellent: No defects in color were found and the solid was reproduced evenly.

good: Some defects in color were found.

poor Defects in color were found and the solid was reproduced unevenly.

In the above, pt means the following:

Character: 1 pt=a character of the size of 0.35 mm×0.35 mm

Line: 1 pt=a line having a width of 0.35 mm

Examples 5 and 6 and Comparative Example 2

Using the members for a mask film prepared in Examples 2 and 3 and Comparative Example 1, flexographic printing plates were prepared in accordance with the same procedures as those conducted in Example 4. The accuracy of printing using each flexographic printing plate was evaluated. The results of the evaluation are shown in Table 2.

Comparative Example 3

Using a laser printer, the same printing patterns as those in Example 4 were created on a polyimide film. Then, the toner exhibiting the pattern was made black (suppressing the transmission of light) by a chemical treatment using FILMSTAR II SYSTEM provided by ZANTE Company and a mask film by a printing machine was prepared. A flexographic printing plate was prepared in accordance with the same procedures as those conducted in Example 4 except that the mask film prepared above was used. Then, the printing test was conducted and the properties were evaluated in accordance with the same procedures as those conducted in Example 4. The results of the evaluation are shown in Table 2.

TABLE 2

|  | Example | | | Comparative Example | |
| --- | --- | --- | --- | --- | --- |
|  | 4 | 5 | 6 | 2 | 3 |
| Member for a mask film | Example 1 | Example 2 | Example 3 | Comparative Example 1 | — |
| Process for preparing a mask film | laser etching | laser etching | laser etching | laser etching | printer type |
| Character |  |  |  |  |  |
| negative | good | good | good | poor | good |
| positive | excellent | excellent | excellent | good | poor |
| Line |  |  |  |  |  |
| negative | good | good | good | poor | good |
| positive | excellent | excellent | excellent | poor | poor |

TABLE 2-continued

| | Example | | | Comparative Example | |
|---|---|---|---|---|---|
| | 4 | 5 | 6 | 2 | 3 |
| Net | | | | | |
| highlighted | good | good | good | poor | poor |
| intermediate | good | good | good | poor | poor |
| shadow | good | good | good | poor | poor |
| Solid | excellent | excellent | excellent | good | excellent |

What is claimed is:

1. A member for producing a mask film, said member comprising a substrate film transmitting ultraviolet light and a resin layer not transmitting ultraviolet light which is disposed on a face of the substrate film, wherein said resin layer has a transmittance of ultraviolet light of 0.1% or smaller and has a thickness of 0.1 to 30 μm, and wherein said resin layer has a color which is capable of being eliminated by irradiation with a laser beam.

2. The member for producing a mask film according to claim 1, wherein the resin layer not transmitting ultraviolet light comprises a blackish pigment.

3. The member for producing a mask film according to claim 1, wherein the resin layer not transmitting ultraviolet light comprises at least one resin selected from the group consisting of a vinyl chloride-vinyl acetate copolymer and a polyurethane-based resin.

4. The member for producing a mask film according to claim 1, wherein a surface of the resin layer not transmitting ultraviolet light has a pencil hardness of H or greater.

5. A process for producing a mask film which comprises etching a resin layer not transmitting ultraviolet light in member for producing a mask film of claim 1 by irradiation with a laser beam and forming a desired pattern.

6. A process for producing a printing plate of a photosensitive resin which comprises irradiating a photosensitive layer of a printing plate material with an active light through a mask film of claim 5 and developing the irradiated photosensitive layer.

7. The process according to claim 6, wherein the printing plate of a photosensitive resin is a flexographic printing plate.

8. The member according to claim 2, wherein the blackish pigment is at least one pigment selected from the group consisting of carbon black; black chromium oxide; titanium black; black iron oxide; and a black organic pigment selected from the group consisting of aniline black and a mixed organic pigment obtained by mixing at least two organic pigments selected from the group consisting of red, blue, green, violet, yellow, cyan and magenta, so as to exhibit an artificial black color.

9. The member according to claim 8, wherein the blackish pigment is carbon black.

10. The member according to claim 8, wherein the substrate film is a film of at least one resin selected from the group consisting of polyethylene terephthalate, polyethylene naphthalate, a polyamide-based resin, a polyimide-based resin, a polyamide imide-based resin, a polyether ether ketone-based resin, a polyether sulfone-based resin, a polyether imide-based resin, a polysulfone-based resin, a polyphenylene sulfide-based resin and a polyester imide-based resin.

11. The member according to claim 10, wherein the resin layer not transmitting ultraviolet light comprises at least one resin selected from the group consisting of a vinyl chloride-vinyl acetate copolymer, a ethylene-acrylate-based copolymer, a styrene-based copolymer, a polyolefin-based copolymer, an acrylic resin, a vinyl acetate-based copolymer, a polyurethane-based resin, a vinyl chloride-based resin and a vinylidene chloride-based resin.

12. The member according to claim 11, wherein the resin layer not transmitting ultraviolet light comprises at least one resin selected from the group consisting of a vinyl chloride-vinyl acetate copolymer and a polyurethane-based resin.

13. The member according to claim 9, wherein the carbon black is contained in an amount of 20 to 60% by weight of the resin layer not transmitting ultraviolet light.

14. The member according to claim 13, wherein the surface of the resin layer not transmitting ultraviolet light has a pencil hardness of H or greater.

15. The member according to claim 8, wherein the resin layer not transmitting ultraviolet light has an average thickness of 0.5 to 20 μm.

16. The member according to claim 8, wherein the resin layer not transmitting ultraviolet light has an average thickness of 0.8 to 10 μm.

17. The member according to claim 13, wherein the carbon black has an average diameter of 10 to 30 nm.

18. The member according to claim 9, wherein the carbon black is selected from the group consisting of channel black, furnace black, acetylene black and thermal black.

19. A process according to claim 6, wherein the printing plate is selected from a group consisting of a flexographic printing plate, a letter press printing plate, an offset printing plate, a gravure printing plate and a screen printing plate.

20. A process according to claim 19, wherein the printing plate is a flexographic printing plate.

* * * * *